United States Patent
Linnen et al.

(10) Patent No.: US 11,836,035 B2
(45) Date of Patent: Dec. 5, 2023

(54) DATA STORAGE DEVICE WITH DATA VERIFICATION CIRCUITRY

(71) Applicant: Western Digital Technologies, Inc., San Jose, CA (US)

(72) Inventors: Daniel Linnen, Naperville, IL (US); Aashish Sangoi, Bangalore (IN); Kirubakaran Periyannan, Santa Clara, CA (US); Judah Gamliel Hahn, Ofra (IL)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/396,199

(22) Filed: Aug. 6, 2021

(65) Prior Publication Data
US 2023/0039071 A1    Feb. 9, 2023

(51) Int. Cl.
*G06F 11/07* (2006.01)
*G06F 3/06* (2006.01)

(52) U.S. Cl.
CPC .......... *G06F 11/079* (2013.01); *G06F 3/0619* (2013.01); *G06F 3/0659* (2013.01); *G06F 3/0679* (2013.01); *G06F 11/0745* (2013.01); *G06F 11/0751* (2013.01); *G06F 11/0772* (2013.01)

(58) Field of Classification Search
CPC ............... G06F 11/079; G06F 11/0745; G06F 11/0751; G06F 11/0772; G06F 3/0619; G06F 3/0659; G06F 3/0679
See application file for complete search history.

(56) References Cited

U.S. PATENT DOCUMENTS

| | | | |
|---|---|---|---|
| 7,676,622 B2 | 3/2010 | Naderi et al. | |
| 9,684,359 B2 | 6/2017 | Kunishige | |
| 10,503,586 B2 | 12/2019 | Barber et al. | |
| 10,866,763 B2 | 12/2020 | Shadmi et al. | |
| 2005/0135367 A1 | 6/2005 | Chandra et al. | |
| 2006/0069851 A1* | 3/2006 | Chung | G06F 13/1668 714/E11.04 |

(Continued)

FOREIGN PATENT DOCUMENTS

| | | |
|---|---|---|
| JP | 2008500626 A | 1/2008 |
| JP | 2008535043 A | 8/2008 |
| JP | 2016126738 A | 7/2016 |

OTHER PUBLICATIONS

Rena, "How Can SPI Devices Use Dummy Bytes for Reading Data of Nonstandard Word Lengths over an SPI Bus," Total Phase.com, <https://www.totalphase.com/blog/author/rena/> 2017, 2 pages.

*Primary Examiner* — Jigar P Patel
(74) *Attorney, Agent, or Firm* — Michael Best & Friedrich LLP

(57) ABSTRACT

A data storage device includes a non-volatile memory device including a memory block having a number of memory dies, and a controller coupled to the memory device. A memory access command is received and a memory access operation based on the received command is performed. A number of bytes transferred during the memory access operation is determined, and the determined number of bytes is analyzed to determine whether the number of transferred bytes is equal to a predetermined number. A transfer status fail bit is set if the number of transferred bytes is not equal to the predetermined number.

17 Claims, 3 Drawing Sheets

(56) References Cited

U.S. PATENT DOCUMENTS

| | | | |
|---|---|---|---|
| 2006/0107184 A1* | 5/2006 | Kim | G11C 29/44 |
| | | | 714/760 |
| 2008/0281997 A1* | 11/2008 | Archer | G06F 13/4269 |
| | | | 710/22 |
| 2013/0124665 A1* | 5/2013 | Blocksome | G06F 15/167 |
| | | | 709/212 |
| 2013/0246650 A1* | 9/2013 | Tsuboki | H04L 49/10 |
| | | | 709/236 |
| 2014/0115278 A1 | 4/2014 | Redford et al. | |
| 2015/0243155 A1* | 8/2015 | Xiong | G08B 21/182 |
| | | | 398/135 |
| 2016/0139837 A1* | 5/2016 | Welker | G06F 11/1004 |
| | | | 711/155 |
| 2019/0377631 A1* | 12/2019 | Hattori | G06F 11/1012 |
| 2020/0042341 A1* | 2/2020 | Gupta | G05D 1/0088 |
| 2020/0358619 A1* | 11/2020 | Ding | H04L 9/006 |

* cited by examiner

DATA STORAGE DEVICE WITH DATA VERIFICATION CIRCUITRY

FIELD

This application relates generally to data storage devices, and more particularly, to data storage devices with data verification circuitry.

BACKGROUND

Memory devices generally include various data checking algorithms and/or circuits to ensure that data read from, or written to, the memory is accurate. However, in some instances, read or write operations may transfer data to/from the memory device where the data fails to include an expected number of bytes, potentially resulting in a failure of the memory device. For example, a clock pulse may be missed by the controller and/or memory read/write circuitry resulting in the data being shifted to be off by one or more bytes (referred to herein as "byte shifting"). Often, these shifted/missing bytes are not detected by the memory controller or read/write circuitry, and therefore can create failures that are unable to be handled by the memory device. For example, byte shifting/missing failures can require a user to cycle power to the memory device, or in some instances, can result in the complete failure of the memory device.

SUMMARY

Error detection and correction circuitry generally does not detect or mitigate the effect of byte shifting (e.g. an improper number of transferred bytes for a given operation). By detecting that an improper number of bytes have been transferred in a given operation (e.g. read or write operations), a memory device using data verification circuitry may perform various actions to prevent failures resulting from the improper number of bytes being transferred. Further, by determining that byte shifting has occurred using the data verification circuitry, one or more status bits or other indications may be provided to a memory controller, a user, etc. By detecting and mitigating byte shifting events, read and write performance, as well as general memory device performance and longevity, may be improved.

One embodiment of the present disclosure includes a data storage device including a non-volatile memory device including a controller and a memory block. The memory block includes a number of memory dies and a data verification circuit. The data verification circuit is configured to receive a memory access command from the controller and perform a memory access operation based on the memory access command. The data verification circuit is further configured to determine a number of bytes that is transferred during the memory access operation, determine whether the number of bytes is equal to a predetermined number of bytes, and, in response to determining that the number of the bytes is not equal to the predetermined number of bytes, set a transfer status fail bit indicating that the number of the bytes is not equal to the predetermined number of bytes.

Another embodiment of the present disclosure includes a method performed by a data storage device having a controller coupled to a non-volatile memory device. The method includes receiving a memory access command from an external device and performing a memory access operation based on the memory access command. The method also includes determining whether a number of bytes that is transferred during the memory access operation and determining whether the number of the bytes is equal to a predetermined number of bytes. In response to determining that the number of the bytes is not equal to the predetermined number of bytes, setting a transfer status fail bit indicating that the number of they bytes is not equal to the predetermined number of bytes.

Another embodiment of the present disclosure includes an apparatus including means for receiving a memory access command from a controller and means for performing a memory access operation based on the memory access command. The apparatus further includes means for determining a number of bytes that is transferred during the memory access operation and means for determining whether the number of they bytes is equal to a predetermined number of bytes. The apparatus further includes means for setting a transfer status bit indicating that the number of the bytes is not equal to the predetermined number of bytes in response to determining that the number of the bytes is not equal to the predetermined number of bytes.

Various aspects of the present disclosure provide for data storage devices with data verification circuitry. The present disclosure can be embodied in various forms, including hardware or circuits controlled by software, firmware, or a combination thereof. The foregoing summary is intended solely to give a general idea of various aspects of the present disclosure and does not limit the scope of the present disclosure in any way.

DETAILED DESCRIPTION

In the following description, numerous details are set forth, such as data storage device configurations, controller operations, and the like, in order to provide an understanding of one or more aspects of the present disclosure. It will be readily apparent to one skilled in the art that these specific details are merely exemplary and not intended to limit the scope of this application. In particular, the functions associated with the controller can be performed by hardware (for example, analog or digital circuits), a combination of hardware and software (for example, program code or firmware stored in a non-transitory computer-readable medium that is executed by a processor or control circuitry), or any other suitable means. The following description is intended solely to give a general idea of various aspects of the present disclosure and does not limit the scope of the disclosure in any way. Furthermore, it will be apparent to those of skill in the art that, although the present disclosure refers to NAND flash, the concepts discussed herein are applicable to other types of solid-state memory, such as NOR, PCM ("Phase Change Memory"), ReRAM, MRAM, DRAM, etc.

Figure 1:
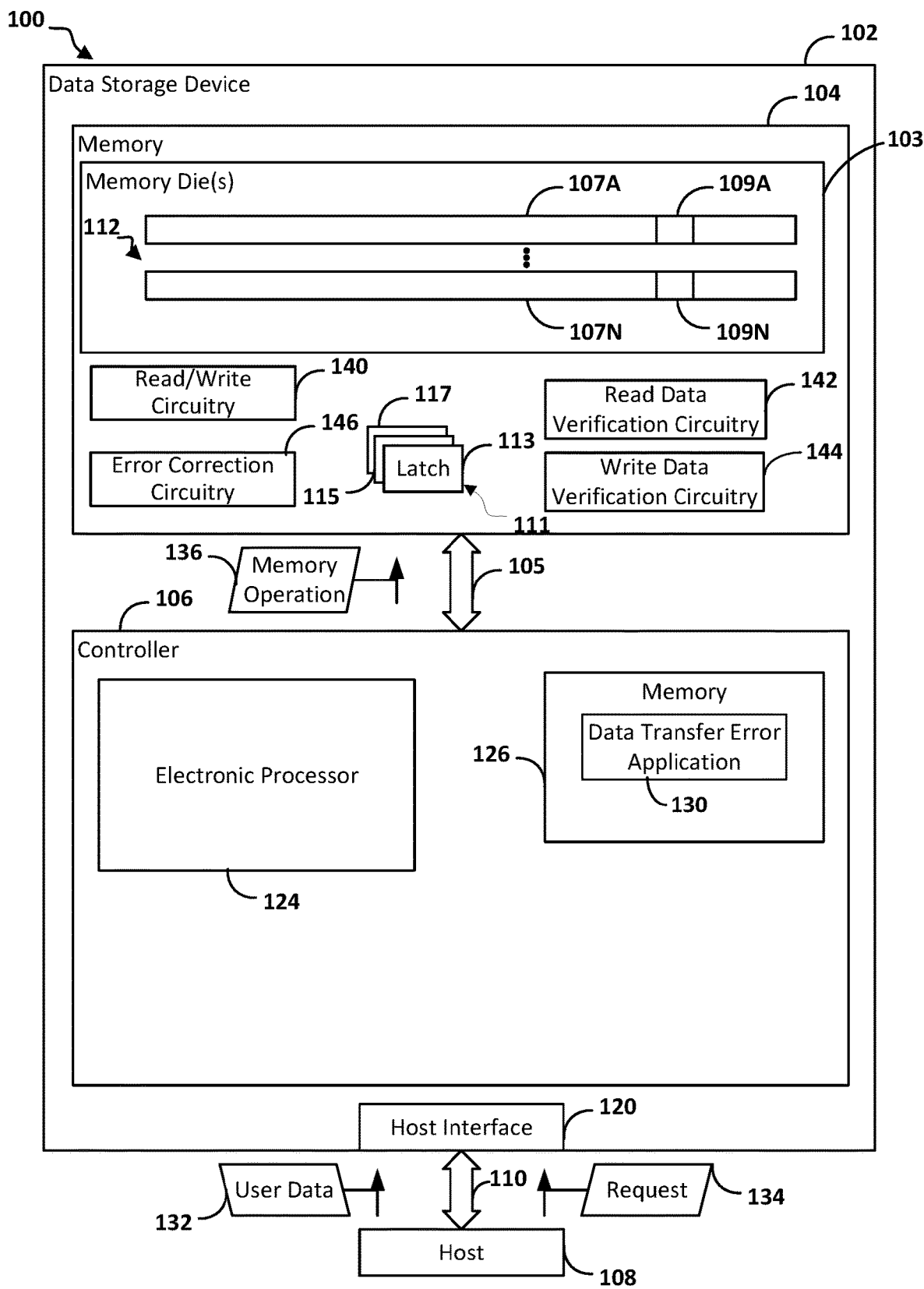
FIG. 1 is a block diagram illustrating one example of a system including a data storage device, according to some embodiments.

FIG. 1 is a block diagram of one example of a system 100 that includes byte shifting detections and mitigation functionality, in accordance with some embodiments of the disclosure. In the example of FIG. 1, the system 100 includes a data storage device 102 in communication with a host device 108. The data storage device 102 includes a memory device 104 (e.g. non-volatile memory) that is coupled to a controller 106.

One example of the structural and functional features provided by the controller 106 are illustrated in FIG. 1. However, the controller 106 is not limited to the structural and functional features provided by the controller 106 in FIG. 1. The controller 106 may include fewer or additional structural and functional features that are not illustrated in FIG. 1.

The data storage device 102 and the host device 108 may be operationally coupled through a connection (e.g., a communication path 110), such as a bus or a wireless connection. In some examples, the data storage device 102 may be embedded within the host device 108. Alternatively, in other examples, the data storage device 102 may be removable from the host device 108 (i.e., "removably" coupled to the host device 108). As an example, the data storage device 102 may be removably coupled to the host device 108 in accordance with a removable universal serial bus (USB) configuration. In some implementations, the data storage device 102 may include or correspond to a solid state drive (SSD), which may be used as an embedded storage drive (e.g., a mobile embedded storage drive), an enterprise storage drive (ESD), a client storage device, a cloud storage drive, or other suitable storage drives.

The data storage device 102 may be configured to be coupled to the host device 108 using the communication path 110, such as a wired communication path and/or a wireless communication path. For example, the data storage device 102 may include an interface 120 (e.g., a host interface) that enables communication using the communication path 110 between the data storage device 102 and the host device 108, such as when the interface 120 is communicatively coupled to the host device 108.

The host device 108 may include a processor and a memory. The memory may be configured to store data and/or instructions that may be executable by the processor. The memory may be a single memory or may include one or more memories, such as one or more non-volatile memories, one or more volatile memories, or a combination thereof. The host device 108 may issue one or more commands to the data storage device 102, such as one or more requests to erase data at, read data from, or write data to the memory device 104 of the data storage device 102. For example, the host device 108 may be configured to provide data, such as user data 132, to be stored at the memory device 104 or to request data to be read from the memory device 104. The host device 108 may include a mobile smartphone, a music player, a video player, a gaming console, an electronic book reader, a personal digital assistant (PDA), a computer, such as a laptop computer or notebook computer, any combination thereof, or other suitable electronic device.

The host device 108 communicates using a memory interface that enables reading from the memory device 104 and writing to the memory device 104. In some examples, the host device 108 may operate in compliance with an industry specification, such as a Universal Flash Storage (UFS) Host Controller Interface specification. In other examples, the host device 108 may operate in compliance with one or more other specifications, such as a Secure Digital (SD) Host Controller specification or other suitable industry specification. The host device 108 may also communicate with the memory device 104 in accordance with any other suitable communication protocol.

The memory device 104 of the data storage device 102 may include a non-volatile memory (e.g., NAND, NOR, BiCS family of memories, or other suitable memory). In some examples, the memory device 104 may be any type of flash memory. For example, the memory device 104 may be two-dimensional (2D) memory or three-dimensional (3D) flash memory. The memory device 104 may include one or more memory dies 103. Each of the one or more memory dies 103 may include one or more memory blocks 112 (e.g., one or more erase blocks). Each memory block 112 may include one or more groups of storage elements, such as a representative group of storage elements 107A-107N. The group of storage elements 107A-107N may be configured as a wordline. The group of storage elements 107A-107N may include multiple storage elements (e.g., memory cells that are referred to herein as a "string" or "array"), such as a representative storage elements 109A and 109N, respectively.

The memory device 104 may include support circuitry, such as read/write circuitry 140, read data verification circuitry, write data verification circuitry 144, and error correction circuitry 146. Although depicted as a single component, the read/write circuitry 140 may be divided into separate components of the memory device 104, such as read circuitry and write circuitry. The read/write circuitry 140 may be external to the one or more memory dies 103 of the memory device 104. Alternatively, one or more individual memory dies 103 may include corresponding read/write circuitry 140 that is operable to read from and/or write to storage elements within the individual memory die independent of any other read and/or write operations at any of the other memory dies. For example, the read/write circuitry 140 may be configured to perform various read/write operations such as initial writing to volatile memory, array commit functions, and other functions as required for a given application. The memory device 104 may further include one or more latches (e.g., a set of latches 111 including latches 113, 115, and 117).

The read data verification circuitry 142 and the write data verification circuitry 144 are shown as separate circuits, but in some embodiments they may be combined into a single data verification circuit. In other examples, the read data verification circuitry 142 and the write data verification circuitry 144 are incorporated within the read/write circuitry 140. In other examples, the read data verification circuitry 142 and the write verification circuitry 144 may be incorporated within the controller 106. The read data verification circuitry 142 and the write data verification circuitry 144 may be configured to perform one or more data verification operations to ensure that the data associated with a read and/or write operation is valid, i.e. includes the expected number of bytes. These verification operations are described in more detail below. The error correction circuitry 146 is configured to perform one or more error correction operations, such as cyclic redundancy check ("CRC"), to validate the contents of data processed by the read/write circuitry 140.

The controller 106 is coupled to the memory device 104 (e.g., the one or more memory dies 103) using a bus 105, an interface (e.g., interface circuitry), another structure, or a combination thereof. For example, the bus 105 may include multiple distinct channels to enable the controller 106 to communicate with each of the one or more memory dies 103 in parallel with, and independently of, communication with the other memory dies 103.

The controller 106 is configured to receive data and instructions from the host device 108 and to send data to the host device 108. For example, the controller 106 may send data to the host device 108 using the interface 120, and the controller 106 may receive data from the host device 108 using the interface 120. The controller 106 is configured to send data and commands (e.g., the memory operation 136, which may be a cycle operation of a memory block of the memory device 104) to the memory device 104 and to receive data from the memory device 104. For example, the controller 106 is configured to send data and a program or write command to cause the memory device 104 to store data to a specified address of the memory device 104. The write command may specify a physical address of a portion of the memory device 104 (e.g., a physical address of a word line of the memory device 104) that is to store the data, as well as a size (e.g. 2 k, 4 k, etc.) of the data to be written.

The controller 106 is configured to send a read command to the memory device 104 to access data from a specified address of the memory device 104. The read command may specify the physical address of a region of the memory device 104 (e.g., a physical address of a word line of the memory device 104), as well as a size (e.g. 2 k, 4 k, etc.) of the data to be read. The controller 106 may also be configured to send data and commands to the memory device 104 associated with background scanning operations, garbage collection operations, and/or wear-leveling operations, or other suitable memory operations.

The controller 106 may include a processor 124, a memory 126, and other associated circuitry. The memory 126 may be configured to store data and/or instructions that may be executable by the processor 124. The memory 126 may include a data transfer error application 130 among other applications, programs, etc. The data transfer error application 130 may be a hardware circuit or instructions that are executable by the processor 124. While shown as being stored in the memory 126, in some examples the data transfer error application 130 may be configured as a circuit within the memory device 104.

The data transfer error application 130 may be configured to execute one or more data transfer error operations. For example, the data transfer error application 130 may store data transfer errors for later review. The stored transfer errors may then later be accessed by one or more users or supervisory controllers for further analysis.

Figure 2:
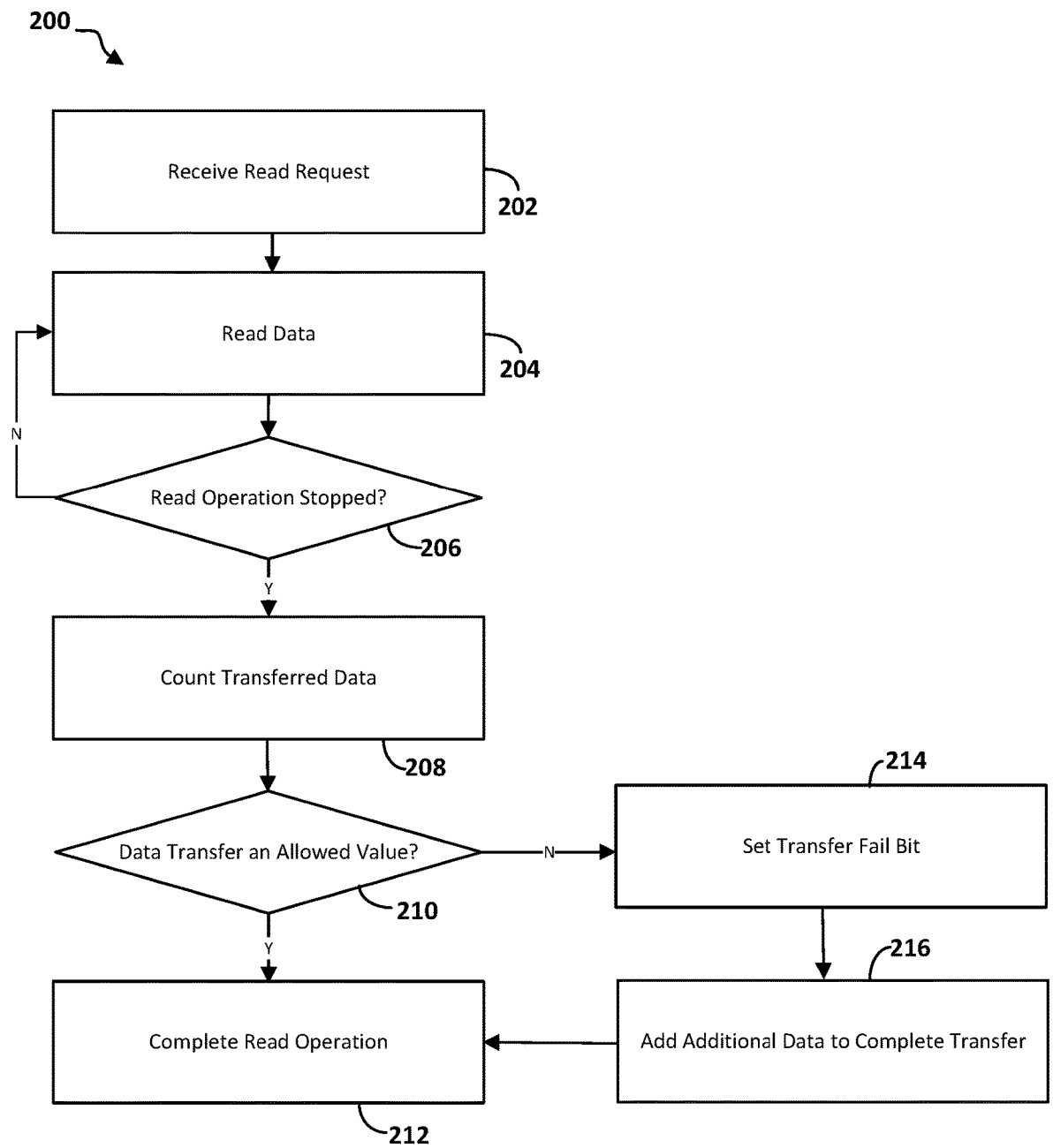
FIG. 2 is a flow chart illustrating a byte shift mitigation process during a read operation, according to some embodiments.

Turning now to FIG. 2, a flow chart illustrating a byte shift mitigation process 200 during a read operation is shown, according to some embodiments. In one embodiment, the byte shift mitigation process 200 is performed by the read data verification circuitry 142. In some embodiments, the byte shift mitigation process 200 is performed by the read data verification circuitry 142 in conjunction with the read/write circuitry 140. In still other embodiments, the read/write circuitry 140 may perform the byte shift mitigation process 200.

At block 202, a read request is received at the memory 104. In one example, the read request may be transmitted to the memory 104 from the controller 106. The controller 106 may receive the read request from the host device 108, as described above. At block 204, a read operation is performed. In one embodiment, the read operation reads the requested data from the memory 104. In one embodiment, the read/write circuitry 140 facilitates the read request and accesses the data within the memory dies 103. In some embodiments, data is read from the memory dies 103, and into the latches 111, which may then be read by the controller 106.

At block 206, a determination is made as to whether the read operation has stopped. In some embodiments, the read operation stops when a number of bytes associated with the read operation have been accessed (e.g. read). In some embodiments, a read duration timer associated with the read operation is accessed to determine whether the read operation has, or should have, stopped. For example, once the read duration timer has expired, the read operation is considered stopped. In one embodiment, the read duration timer is within the read/write circuitry 140. In one embodiment, the read duration timer is a time value associated with a given read command. For example, the time value may be based on a size of the data requested in the read request. The time value may be a time required to perform a given read operation for the given data storage device 102. Further, an additional delay, such as 10% may be added to the time value to allow for delays in performing an associated read operation. Additionally, time delay values of more than 10% or less than 10% are also contemplated as required for a given application. In one embodiment, the time value may have a value from 10 nanoseconds to 50 nanoseconds. However, values of less than 10 nanoseconds and more than 50 nanoseconds are also contemplated. In some embodiments, the time delay values are dependent on the type of memory device. In one embodiment, a device, such as the controller 106, stops the requesting read operations for a period of time (e.g. read duration timer), such that the data count can be verified as described below. In still further examples, one or more read complete bits may be set once the read is completed. For example, the read/write circuitry 140 may set a read complete bit when the read operation stops.

In response to determining that the read operation has not stopped, the read operation is continued at block 204. In response to determining that the read operation has stopped, the quantity of the read data is counted at block 208. In one embodiment, a number of bytes associated with the read operation are determined and/or counted. In one embodiment, the read data verification circuitry 142 determines the quantity of the read data. However, in other examples the read/write circuitry 140 determines the quantity of the transferred read data. The quantity of data expected for the requested read operation may be based on the read request. For example, the read request may request 4,096 bytes of data (e.g. a 4 k data read). Other data read sizes, such as 1 k, 2 k, 8 k, etc. may also be associated with the read request.

At block 210, a determination is made as to whether the transferred data is equal to predetermined quantity of data. In one embodiment, the read data verification circuitry 142 performs the verification. However, in other embodiments, the read/write circuitry 140 performs the verification. The data is determined to be equal to a predetermined quantity of data where the quantity of transferred data equals the predetermined quantity of data. For example, as noted above a 4 k data read has an expected (e.g. predetermined) number of bytes equal to 4,096. Thus, where 4,096 bytes are determined to be transferred during the read operation, the transferred data is determined to be equal to a predetermined value. However, where 4,095 bytes are determined to have been transferred during the read operation, the transferred data is determined not to be equal to a predetermined value. In some examples, the predetermined number of bytes may be specific for a given data storage device 102. For example, while a 4 k transfer generally includes 4,096 bytes of data, certain data storage devices and associated protocols may include more data to account for error correction bits, address bits, and/or other information as required for a given application. Thus, data storage devices 102 may have defined values of predetermined number of bytes.

In response to determining that the transferred data is equal to a predetermined value, the read operation is completed at block 212. In response to determining that the transferred data is not equal to a predetermined value, a transfer fail bit is set at block 214. The transfer fail bit may be stored in the data transfer error application 130. However, in other embodiments, the transfer fail bit may be stored in the read/write circuitry 140 and/or the read data verification circuitry 142.

At block 216, additional data is added to the transferred data to ensure that the amount of transferred data is equal to a predetermined value. For example, where the transferred data for a 4 k read request only equals 4,095 bytes, an additional 1 byte may be appended to the transferred data to ensure that the transferred data includes a predetermined number of bytes. More than 1 byte may be appended to the transferred data as needed to ensure that the transferred data includes predetermined number of bytes. In one embodiment, the read data verification circuitry 142 adds the required additional data to the transferred data. In other embodiments, the read/write circuitry 140 adds the required additional data to the transferred data. In one embodiment, the appended data may always be the same, for example, a logic 1 or a logic 0. However, in other examples, the appended data may be random, such as data generated based on atmospheric noise. In one example, a clock signal may be toggled equal to the required number of missing bytes, allowing random data to fill the remaining bytes in the transferred data. Regardless of what data is appended, the setting of the transfer fail bit at block 214 ensures that the data is understood to be invalid. Once the additional data is added to the transferred data, the read operation is completed at block 212.

By appending the missing data to the transferred data, the transferred data is made to include a predetermined data value (e.g. an allowable number of bytes). As noted above, byte shifting (e.g. non-allowable data byte values) can result in failure or "bricking" of a data storage device, such as data storage device 102. In some instances, the data storage device 102 may be reset by a power recycle, but in other instances the data storage device 102, or portions thereof, may not be repairable. Byte shifting can result in one or more requested commands failing to be completed as the correct number of bytes is never received. This can cause one or more watchdog routines to indicate a failure thereby faulting out the data storage device 102.

Generally, byte shifting is not a common occurrence in a data storage device; however, as noted above the occurrence of byte shifting can cause substantial, and in some cases irreversible, damage to the data storage device. Byte shifting may occur as a device ages due to degradation in the copper traces in the word lines, breakdowns in the silicon matrix, voltage instability within the data storage device 102, age of the data storage device, alpha particle degradation, etc. Furthermore, timing issues between a controller and one or more memories may result in missed clock pulses which can result in byte shifting.

Figure 3:
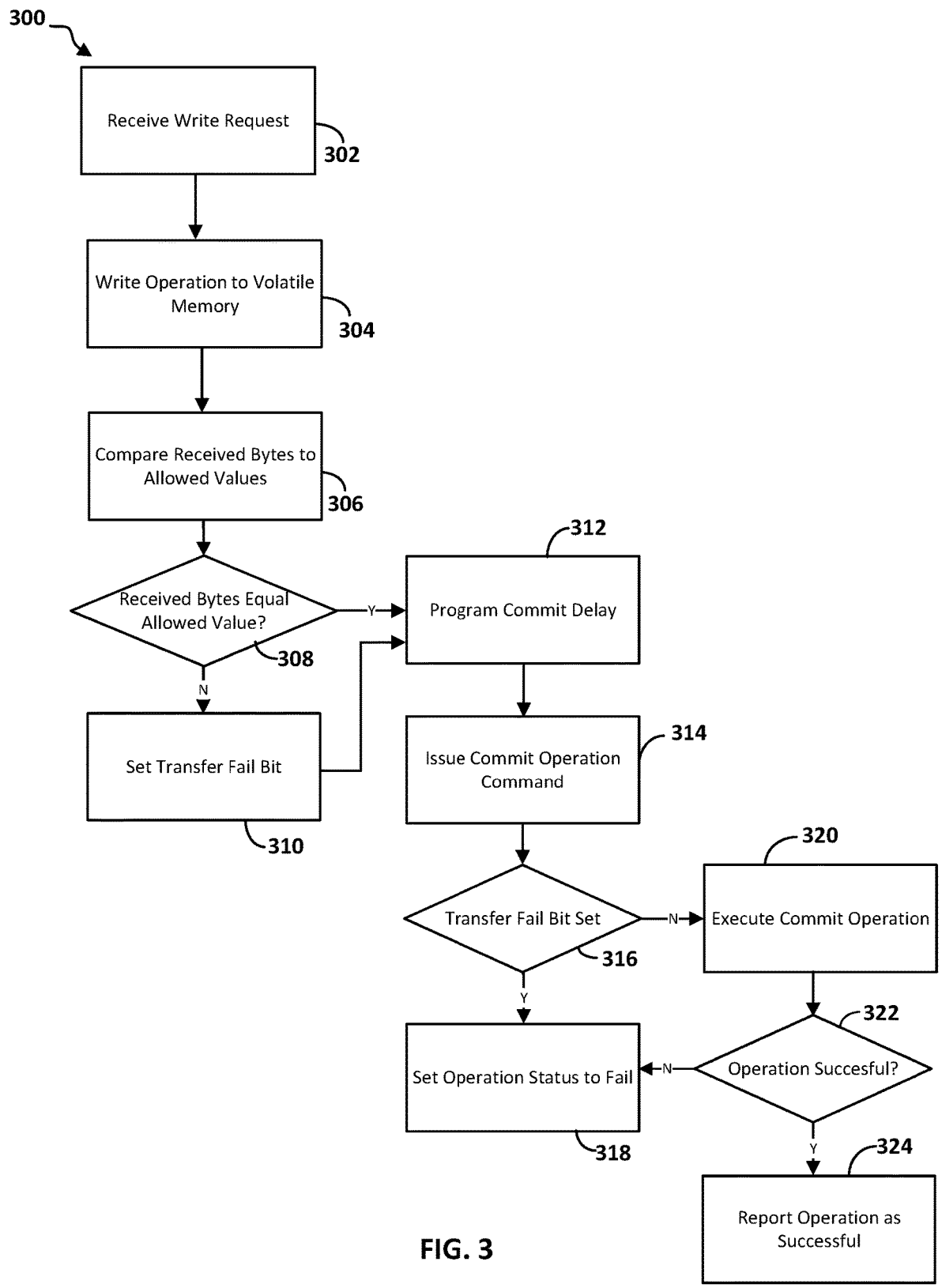
FIG. 3 is a flow chart illustrating a byte shift mitigation process during a write operation, according to some embodiments.

Turning now to FIG. 3, flow chart illustrating a byte shift verification process 300 during a write operation is shown, according to some embodiments. In one embodiment, the byte shift verification process 300 is performed by the write data verification circuitry 144. In some embodiments, the byte shift verification is performed by the write data verification circuitry 144 in conjunction with the read/write circuitry 140. In still other embodiments, the read/write circuitry 140 may perform the byte shift verification process 200.

At block 302, a write request is received at the memory 104. In one example, the write request may be transmitted to the memory 104 from the controller 106. The controller 106 may receive the write request from the host device 108, as described above. At block 304, the requested data is written to a volatile portion of the memory, such as volatile latches 111. In one embodiment, the read/write circuitry 140 facilitates the write request and transfers the data to the volatile latches 111.

At block 306, the quantity of the received data (e.g. the received bytes) is compared to a predetermined value. For example, where the write request is a 4 k write request, the predetermined value may be 4,096 bytes. For a 2 k write request, the predetermined value may be 2,048 bytes. For all sized write requests, a predetermined value will exist. In one embodiment, the quantity of received data associated with the write operation are determined and/or counted by the write data verification circuitry 144. However, in other examples the read/write circuitry 140 determines quantity of the received data. As noted above, the quantity of data expected for the requested write operation may be based on the write request. For example, the write request may request 4,096 bits of data (e.g. a 4 k data read). Other data write sizes, such as 1 k, 2 k, 8 k, etc. may also be associated with the write request. In some examples, the predetermined number of bytes may be specific for a given data storage device 102. For example, while a 4 k transfer generally includes 4,096 bytes of data, certain data storage devices and associated protocols may include more data to account for error correction bits, address bits, and/or other information as required for a given application. Thus, data storage devices 102 may have defined values of predetermined data storage bytes.

At block 308, a determination is made as to whether the received data is equal to a predetermined quantity of data. In one embodiment, the write data verification circuitry 144 performs the verification. However, in other embodiments, the read/write circuitry 140 performs the verification. The received data is determined to be equal to a predetermined quantity of data where the quantity of received data equals the predetermined quantity of data. For example, as noted above a 4 k data write has an expected number of bytes equal to 4,096. Thus, where 4,096 bytes are determined to be received during the write operation, the data transfer is allowable as the received number of bytes is equal to the predetermined number of bytes. However, where 4,095 bytes are determined to have been received during the write operation, the data transfer is not allowable as the received number of bytes is not equal to the predetermined number of bytes. In response to determining that the data transfer is not allowable, a transfer fail bit is set at block 310. The transfer fail bit may be stored in the data transfer error application 130. However, in other embodiments, the transfer fail bit may be stored in the read/write circuitry 140 and/or the write data verification circuitry 144. Upon setting the transfer fail bit, a program commit delay is initiated at block 312.

Setting the transfer fail bit during writing allows the data storage device 102, and therefore the controller 106, to understand that a transfer issue has occurred, thereby allowing for debugging and/or error management to be performed prior to an attempt to read the data being made, which may result in corrupted data being accessed, or a failure of the data storage device 102 due to the improper data. Thus, by providing the transfer fail bit status to the data storage device 102, potential failures during a subsequent read operation may be reduced or eliminated. Furthermore, the transfer fail bit allows for additional debugging to prevent future transfer errors. For example, one or more arrays (e.g. storage elements 107A-107N) and/or memory dies 103 may be retired in response to a data transfer error as described above. In some instances, additional information such as a number of read/write cycles for a given storage elements 107A-107N and/or memory dies 103 may be used in conjunction with the transfer error bit status to determine whether the associated storage elements 107A-107N and/or memory dies 103 should be retired. Additionally, where the data storage device 102 is part of an enterprise system, information associated with the transfer fail bit status may be provided to system administrators and/or enterprise controllers. This is an improvement over previous data storage devices which only indicated that the data was corrupted when a byte shift error occurs without providing any information or status data indicating that the error was due to a byte shifting error.

In response to determining that the data transfer is an allowable value (i.e. not equal to a predetermined value), the program commit delay is initiated at block 312. The program commit delay is a delay between writing data associated with a write command to volatile memory, such as latches 111, and committing the data to one or more arrays (e.g. wordlines), such as storage elements 107A-107N. In some embodiments, the commit delay may be a defined time period (e.g. 10 nanoseconds). However, in other examples, the commit delay may be more than 10 nanoseconds or less than 10 nanoseconds. In other examples, the commit delay may be based on the size of the write request, such that the larger the write request, the larger the program commit delay. In some examples, there may be no commit delay.

Upon the program commit delay being completed, a commit operation command is issued at block 314. In one embodiment, the commit operation command is issued by the read/write circuitry 140. In other embodiments, one or more other components of the data storage device 102, such as the controller 106, issue the commit operation command. The commit operation command instructs the read/write circuitry 140 to write received data to the one or more static arrays, such as storage elements 107A-107N and/or 109A-109N. Upon issuing the commit operation command, a determination is made as to whether the transfer fail bit has been set at block 316. In one embodiment, the read/write circuitry 140 determines whether the transfer fail bit is set. In other embodiments, one or more of the read data verification circuitry 142 and the write data verification circuitry 144 determines whether the transfer fail bit is set. In other embodiments, one or more other components of the data storage device 102, such as the write data verification circuitry 144, the error correction circuitry 146, and/or the controller 106 determines whether the transfer fail bit has been set.

In response to determining that the transfer fail bit has been set, the operation status is set to fail at block 318. In one embodiment, the operation status may be set to fail within the data transfer error application 130. In other embodiments, the operation status may be set to fail within the error correction circuitry 146. In addition to setting the operation status to fail, additional data may be stored and associated with the operation failure. For example, an indication may be provided that shows that the transfer fail bit was set based on the received bytes not being an allowed value. Other information, such as write request size, missing byte information, write addresses, device temperature, and/or a number of read/write operations for a given storage element 107A-107N may also be stored along with the operation fail status.

In response to determining that the transfer fail bit is not set, the commit operation (e.g. writing the received data into one or more static arrays) is performed at block 320. At block 322, the read/write circuit 140 determines whether the commit operation was successful. In response to determining that the commit operation was not successful, the operation status is set to fail at block 318. In response to determining that the commit operation was successful, the operation is reported as successful at block 324. In one example, the read/write circuitry 140 may report the successful operation to one or more components, such as the data transfer error application 130, the write data verification circuitry 144, and/or the controller 106.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain implementations and should in no way be construed to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:
1. A data storage device, comprising:
a non-volatile memory device including a controller;
a memory block including a plurality of memory dies; and
a data verification circuit configured to:
  receive a memory access command from the controller,
  perform a memory access operation based on the memory access command, determine a number of bytes that is transferred during the memory access operation, determine whether the number of transferred bytes is equal to a predetermined number of bytes, in response to determining that the number of transferred bytes is not equal to the predetermined number of bytes, append a second number of additional bytes to the transferred bytes, wherein the second number of additional bytes is equal to a difference between the predetermined number of bytes and the number of transferred bytes, and in response to determining that the number of transferred bytes is not equal to the predetermined number of bytes, set a transfer status fail bit indicating that the number of transferred bytes is not equal to the predetermined number of bytes, wherein the second number of additional bytes are randomly generated bytes.

2. The data storage device of claim 1, wherein the memory access operation is a read operation.

3. The data storage device of claim 1, wherein the memory access operation is a write operation.

4. The data storage device of claim 3, wherein the data verification circuit is further configured to:

issue a commit operation command to write the transferred bytes to an array within one or more of the memory dies, determine whether the transfer status fail bit is set, generate an indication of a failure in the write operation based on determining that the transfer status fail bit is set; and prevent a commit operation in response to determining that the transfer status fail bit is set.

5. The data storage device of claim 4, wherein the memory block is further configured to transmit the failure indication to the controller.

6. The data storage device of claim 1, wherein the predetermined number of bytes is based on a data size associated with the memory access command.

7. The data storage device of claim 1, wherein the data verification circuit is part of the memory block.

8. A method performed by a data storage device having a controller coupled to a non-volatile memory device, the method comprising:

receiving a memory access command from an external device;

performing a memory access operation based on the memory access command;

determining a number of bytes that is transferred to the memory device during the memory access operation;

determining whether the number of transferred bytes is equal to a predetermined number of bytes;

in response to determining that the number of transferred bytes is not equal to the predetermined number of bytes, appending a number of additional bytes to the transferred bytes, wherein the number of additional bytes is equal to a difference between the predetermined number of bytes and the number of transferred bytes; and in response to determining that the number of transferred bytes is not equal to the predetermined number of bytes, setting a transfer status fail bit indicating that the number of transferred bytes is not equal to the predetermined number of bytes, wherein the number of additional bytes are one of randomly generated bytes, logic high bytes, and logic low bytes.

9. The method of claim 8, wherein the memory access operation is read operation.

10. The method of claim 8, wherein the memory access operation is a write operation.

11. The method of claim 10, further comprising:

issue a commit operation command to write the bytes to an array within one or more memory dies;

determine whether the transfer status fail bit is set;

generate an indication of a failure in the write operation based on determining that the transfer status fail bit is set; and prevent a commit operation associated with the commit operation command in response to determining that the transfer status fail bit is set.

12. The method of claim 11, further comprising storing the indication in a memory of the controller.

13. The method of claim 12, wherein the predetermined number of bytes is based on a data size associated with the memory access command.

14. An apparatus, comprising:

means for receiving a memory access command from a controller;

means for performing a memory access operation based on the memory access command;

means for determining a number of bytes that is transferred during the memory access operation;

means for determining whether the number of transferred bytes is equal to a predetermined number of bytes;

means for appending a second number of additional bytes to transferred bytes in response to determining that the number of transferred bytes is not equal to the predetermined number of bytes, wherein the second number of additional bytes is equal to a difference between the predetermined number of bytes and the number of transferred bytes; and means for setting a transfer status fail bit indicating that the number of transferred bytes is not equal to the predetermined number of bytes in response to determining that the number of transferred bytes is not equal to the predetermined number of bytes, wherein the second number of additional bytes are randomly generated bytes.

15. The apparatus of claim 14, wherein the memory access operation is a read operation.

16. The apparatus of claim 14, wherein the memory access operation is a write operation, the apparatus further comprising:

means for issuing a commit operation command to write the transferred bytes to an array within one or more memory dies;

means for determining whether the transfer status fail bit is set;

means for generating an indication of a failure in the write operation based on determining that the transfer status fail bit is set; and means for preventing a commit operation associated with the commit operation command in response to determining that the transfer bit is set.

17. The apparatus of claim 16, wherein the predetermined number of bytes is based on a data size associated with the memory access command.

* * * * *